United States Patent
Takahashi

(10) Patent No.: US 8,008,721 B2
(45) Date of Patent: Aug. 30, 2011

(54) HIGH-VOLTAGE-RESISTANT MOS TRANSISTOR AND METHOD FOR MANUFACTURING THE SAME

(75) Inventor: Norihiro Takahashi, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 776 days.

(21) Appl. No.: 11/878,986

(22) Filed: Jul. 30, 2007

(65) Prior Publication Data
US 2008/0079096 A1 Apr. 3, 2008

(30) Foreign Application Priority Data
Sep. 29, 2006 (JP) ................. 2006-267822

(51) Int. Cl.
*H01L 27/01* (2006.01)
*H01L 27/12* (2006.01)
*H01L 31/0392* (2006.01)

(52) U.S. Cl. ........................ 257/347

(58) Field of Classification Search .......... 257/347–354, 257/E27.112, E29.147
See application file for complete search history.

(56) References Cited

U.S. PATENT DOCUMENTS
2006/0180861 A1* 8/2006 Tsujiuchi et al. ............ 257/347

FOREIGN PATENT DOCUMENTS
| JP | 10-303319 | 11/1998 |
| JP | 11-031819 | 2/1999 |
| JP | 2002-289845 | 10/2002 |

OTHER PUBLICATIONS

Foreign office action issued Oct. 28, 2008 in the corresponding JP Application No. 2006-267822 with an English translation.

* cited by examiner

*Primary Examiner* — Cuong Q Nguyen
(74) *Attorney, Agent, or Firm* — Rabin & Berdo, P.C.

(57) ABSTRACT

A high-voltage-resistant MOS transistor having high electrical strength and a method for manufacturing the same, whereby to effectively decrease cost of manufacturing, are provided. The gate electrode includes a pair of separate opposition parts and a combination part sandwiched by the pair of opposition parts so that the opposition parts are opposed to each other so as not to overlap with the element region and the combination part overlaps with the element region. Each length of the opposition parts in a junction direction is longer than that of the combination part. The sidewall insulating film is formed so as to be continuous between the opposition parts and partially overlap with the element region. Therefore, the number of processes and a processing period for forming the MOS transistor can be decreased and uniformity of LDD lengths of the MOS transistors can be improved.

6 Claims, 7 Drawing Sheets

HIGH-VOLTAGE-RESISTANT MOS TRANSISTOR AND METHOD FOR MANUFACTURING THE SAME

BACKGROUND OF THE INVENTION

1. Field of the Invention

The present invention relates to a MOS (Metal-Oxide Semiconductor) transistor and a method for manufacturing the same, and in particular, a high-voltage-resistant MOS transistor having LDD (Lightly Doped Drain) structures and a method for manufacturing the same.

2. Description of the Related Art

A semiconductor device such as a MOS FET having LDD structures is presently known. The LDD structures are formed as lightly doped regions with a dopant concentration lower than that of source and drain regions for the purpose of suppressing electrical field at the drain region and prevent degradation of the drain region. By forming the lightly doped regions in the semiconductor device, it is attempted to manufacture the semiconductor device having high-voltage-resistance.

In a high-voltage resistant offset MOS transistor having a LDD structure, an electrical strength and an on-resistance are dependent upon the length of a lightly doped region referred to as a LDD length. A method for manufacturing a semiconductor device, whose LDD length can be arbitrarily designed, is disclosed in, for example, Japanese Patent Application Laid-Open Publication No. 2002-289845 (document D1).

However, in the method disclosed in document D1, it is difficult to eliminate a photolithography process and an ion implantation process for forming lightly doped regions. Such steps increase the number of processes and a processing period for forming the semiconductor device, thus increasing the cost of production.

In addition, in the conventional MOS transistor, there arises a problem that lightly doped diffusion regions can not be formed on the basis of a predetermined electrical strength. The conventional MOS transistor, whose LDD length is arbitrarily configured, also has a problem that photolithographic process can not be eliminated at the time of ion implantation for forming lightly doped diffusion regions and that the ion implantation is required to be performed at least twice.

SUMMARY OF THE INVENTION

It is an object of the present invention to provide a high-voltage-resistant MOS transistor having high electrical strength and a method for manufacturing the same, whereby to effectively decrease cost of manufacturing.

According to a first aspect of the present invention, there is a provided a MOS transistor comprising a semiconductor substrate having a first conductive type, an element isolation oxide film partially formed in the semiconductor substrate, an element region formed in the semiconductor substrate so as to be defined by the element isolation oxide film, a gate oxide film formed over a surface of the element region, a gate electrode partially formed on surfaces of the element isolation oxide film and the gate oxide film, a sidewall insulating film formed so as to surround sidewalls of the gate electrode, a pair of lightly doped diffusion regions having a second type conductivity opposed to the first type conductivity partially formed in the element region positioned below the sidewall insulating film, the lightly doped diffusion regions being opposed to each other, a pair of heavily doped diffusion regions having the second type conductivity, each of the heavily doped diffusion regions being partially formed in each of the lightly doped diffusion regions which do not overlap with the sidewall insulating film, the heavily doped diffusion regions which have a conductivity higher than that of the lightly doped diffusion regions being separated from the gate electrode so as to be opposed to each other. The gate electrode includes a pair of separate opposition parts and a combination part sandwiched by the pair of opposition parts so that the opposition parts are opposed to each other so as not to overlap with the element region and the combination part overlaps with the element region. Each length of the opposition parts in a junction direction of the heavily doped diffusion region and said lightly doped diffusion region is longer than that of the combination part. The sidewall insulating film is formed so as to be continuous between the opposition parts and partially overlap with the element region.

According to a second aspect of the present invention, there is a provided method for manufacturing a MOS transistor comprising a step of forming an element isolation oxide film onto a semiconductor substrate having a first conductive type so that an element region is defined by the element isolation oxide film, a step of forming a gate oxide film over a surface of the element region, a step of partially forming a gate electrode on surfaces of the element isolation oxide film and the gate oxide film, the gate electrode including a pair of opposition parts and a combination part sandwiched by the combination parts so that the opposition parts are opposed to each other via the combination part so as not to overlap with the element region and the combination part overlaps with the element region, a step of selectively implanting ionized atoms having a second conductive type opposed to the first conductive type onto a surface of the gate oxide film on which the gate electrode is not formed while utilizing the element isolation oxide film and the gate electrode as a mask so as to partially form a pair of lightly doped diffusion regions, which does not overlap with the gate electrode, having the second conductive type in the element region, a step of forming a sidewall insulating film so as to cover the gate electrode, a step of partially etching the sidewall insulating film so as to form a residual sidewall insulating film surrounding side walls of the gate electrode, the residual sidewall insulating film being formed as a residual part of the sidewall insulating film which is not etched, and a step of further implanting ionized atoms having the second conductive type into the pair of lightly doped diffusion regions and the element region positioned below the pair of lightly doped diffusion regions while utilizing the element isolation oxide film, and the residual sidewall insulating film as a mask so as to partially form a pair of heavily doped diffusion region in the pair of lightly doped diffusion regions and the element region, the pair of heavily doped diffusion regions having a conductivity higher than that of the pair of lightly doped diffusion regions. Each length of the opposition parts in the direction of a junction direction of the heavily doped diffusion region and the lightly doped diffusion region is longer than that of the combination part. The residual sidewall insulating film is formed so as to be continuous between the opposition parts and partially overlap with the element region.

The gate electrode partially formed on the element isolation film and the gate oxide film includes the opposition parts and the combination part sandwiched by the opposition parts. The combination part is positioned so as to partially overlap with the element region. The opposition parts, which are separated so as to be opposed to each other, are formed so as not to overlap with the element region. Therefore, the lightly doped diffusion regions, each having a LDD length necessary for a predetermined electrical strength, can be formed.

A photolithographic process at the ion implantation process can be eliminated since the lightly doped diffusion regions are formed by the ion-implantation while utilizing the gate electrode and element isolation film as a mask. The ion-implantation process for forming the lightly doped diffusion regions is performed only once, thus decreasing the number of processes and a processing period for forming the MOS transistor. Therefore, a high-voltage-resistant MOS transistor with high cost effectiveness can be provided.

BRIEF DESCRIPTION OF THE INVENTION

DETAILED DESCRIPTION OF THE INVENTION

First and second embodiments of the high-voltage-resistant MOS transistor according to the present invention will now be described in reference to the accompanying drawings of FIGS. 1A to 5B.

First Embodiment

FIGS. 1A to 5B show structures of the first embodiment in steps of manufacturing.

Figure 1A:
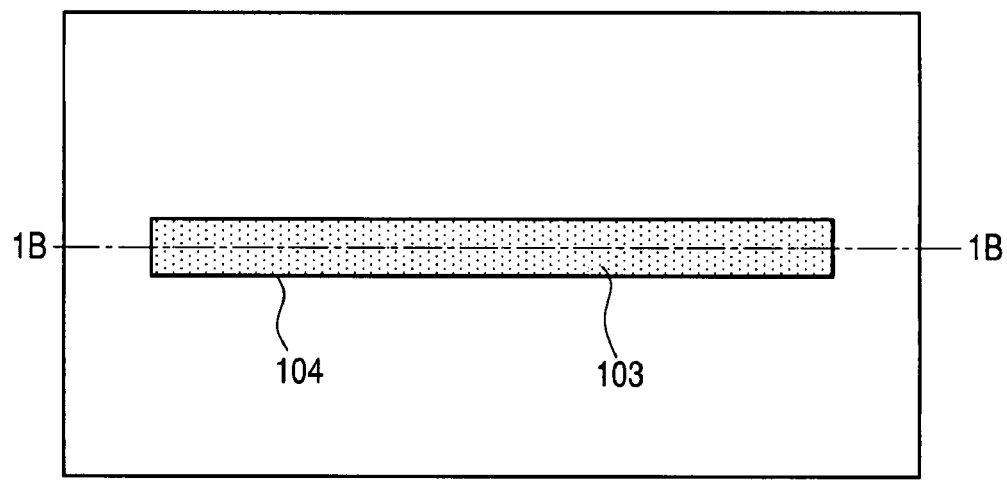
FIG. 1A is a plan view showing a first embodiment of the MOS transistor according to the present invention in a beginning step of manufacturing.
Figure 1B:
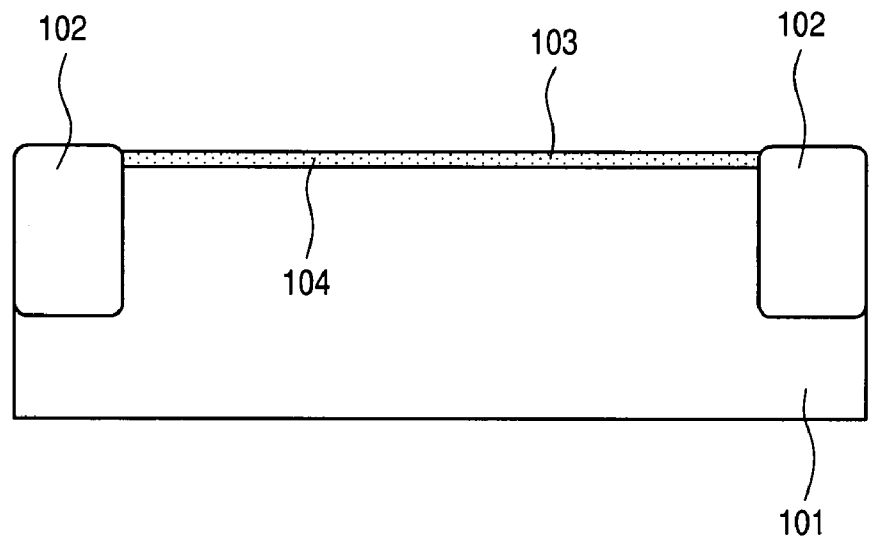
FIG. 1B is a cross-sectional view showing the first embodiment taken along 1B-1B line of FIG. 1A.

FIG. 1A is a plan view showing the first embodiment of the MOS transistor according to the present invention in a beginning step of manufacturing. FIG. 1B is a cross-sectional view showing the first embodiment taken along 1B-1B line of FIG. 1A. As shown in FIGS. 1A and 1B, a silicon substrate 101 having a p-type conductivity is prepared. An element isolation oxide film 102 is partially formed in the p-type silicon substrate 101 by using a well-known oxidative technology such as a LOCOS process, so that an element region 104 is defined in the p-type silicon substrate 101 by the element isolation oxide film 102. Subsequently, a gate oxide film 103 having, for example, a thickness of 100 to 400 Å is formed over a surface of the element region 104 by using, for instance, a well-known oxidative technology.

Figure 2A:
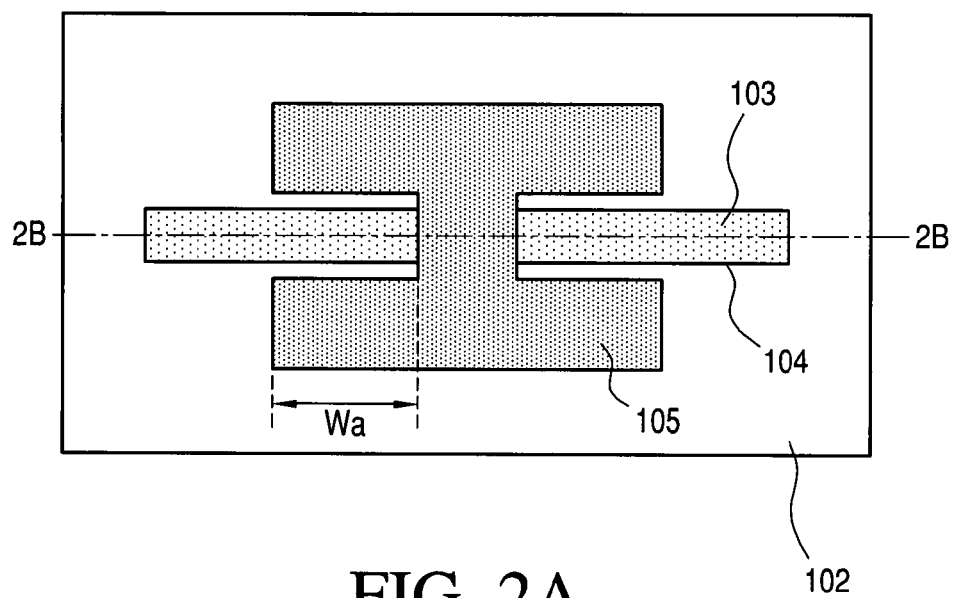
FIG. 2A is a plan view showing the first embodiment of the MOS transistor according to the present invention in a further step of manufacturing.
Figure 2B:
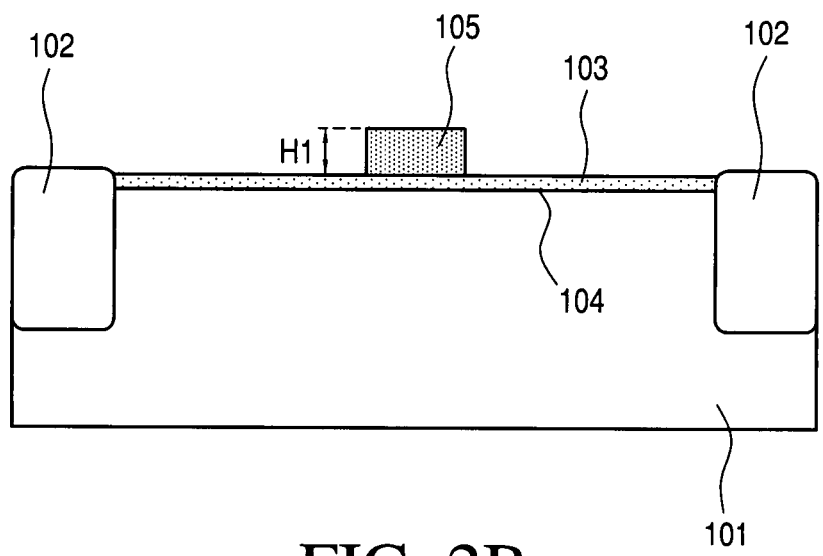
FIG. 2B is a cross-sectional view showing the first embodiment taken along 2B-2B line of FIG. 2A.

FIG. 2A is a plan view showing the first embodiment in a further step of manufacturing. FIG. 2B is a cross-sectional view showing the first embodiment taken along 2B-2B line of FIG. 2A. As shown in FIGS. 2A and 2B, a gate electrode 105 having a thickness of, for instance, 3000 Å is partially formed on surfaces of the element isolation oxide film 102 and the gate oxide film 103 by using a well-known technology such as a CVD technology, a photolithographic technology, and a well-known etching technology. The thickness of the gate electrode 105 is denoted by H1 in FIG. 2B. The gate electrode 105 is composed of a material such as polysilicon. As shown in FIG. 2A, the gate electrode 105 includes a pair of opposition parts and a combination part sandwiched by the pair of the opposition parts. The pair of the opposition parts, each of which are separated via the combination part so as to be opposed to each other, are positioned on the element isolation oxide film 102 so as not to overlap with the element region 104 and the gate oxide film 103. The combination part is positioned on the element isolation oxide film 102 and the gate oxide film 103 so as to partially overlap with the element region 104. In the first embodiment, the pair of the opposition parts is positioned in parallel to a longitudinal direction of the element region 104, which direction corresponds to a direction of an n-p-n junction of the MOS transistor. In the n-p-n junction, a channel region having the p-type conductivity is sandwiched by heavily doped diffusion regions having an n-type conductivity via lightly doped diffusion regions. These regions will be formed in later steps. The shape of the gate electrode 105 is not limited to a H-shaped structure, in other wards, a dog born shaped structure or C-shaped structures. It is configured that each length of the opposition parts is longer than that of the combination part in the longitudinal direction of the element region 104. The opposition parts are integrally combined at middle points thereof by the combination part. Thus, the gate electrode 105 has concaves which are substantially symmetric with respect to a center line thereof. By forming the gate electrode 105 on the gate oxide film 103, the surface of the gate oxide film 103 are divided into two surface regions by positioning the combination part of the gate electrode 105 so as to overlap with the element region 104.

Figure 3A:
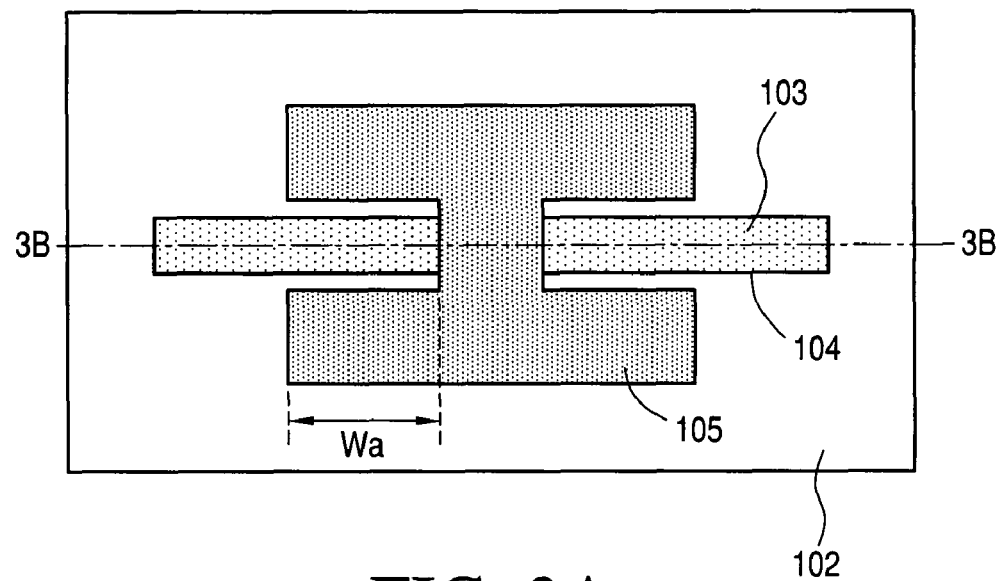
FIG. 3A is a plan view showing the first embodiment of the MOS transistor according to the present invention in a further step of manufacturing.
Figure 3B:
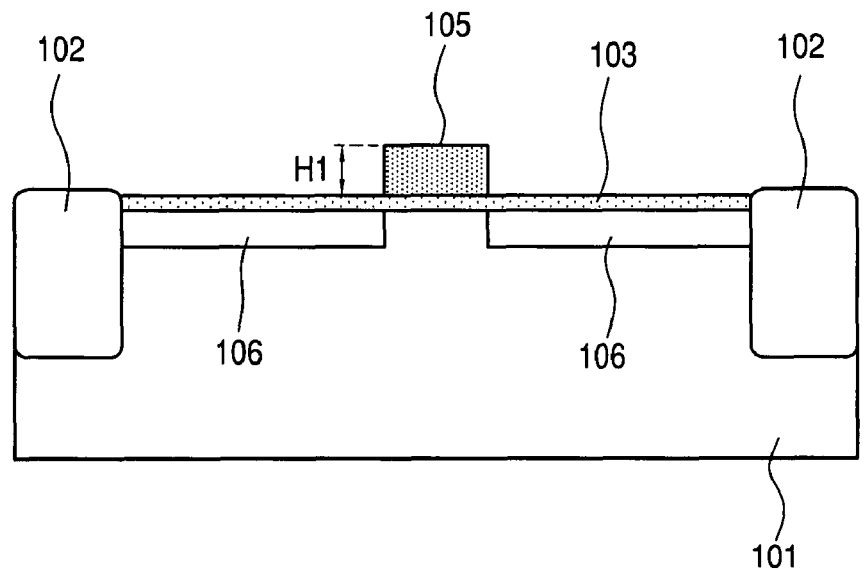
FIG. 3B is a cross-sectional view showing the first embodiment taken along 3B-3B line of FIG. 3A.

FIG. 3A is a plan view showing the first embodiment in a further step of manufacturing. FIG. 3B is a cross-sectional view showing the first embodiment taken along 3B-3B line of FIG. 3A. As shown in FIGS. 3A and 3B, a pair of lightly doped diffusion regions 106 having an n-type conductivity are partially formed in the element region 104 by implanting ionized dopants having an n-type conductivity onto the two surface regions of the gate oxide film 103 while the gate electrode 105 and the element isolation oxide film 102 are utilized as a mask. The ion implantation is performed by using a well-known ion implantation technology under a condition that ionized phosphorous are dosed at a rate of $1 \times 10^{13}$ cm$^{-2}$ and at an acceleration voltage of 30 keV. The lightly doped diffusion regions 106 having the n-type conductivity are formed into two parts of the element region 104, which parts do not overlap with the gate electrode 105 so as to sandwich a part of the element region 104 below the gate electrode 105. The part of the element region 104 below the gate electrode 105 corresponds to a channel region of the MOS transistor. The channel region sandwiched by the n-type lightly doped diffusion regions 106 has the p-type conductivity because the channel region is not ion-implanted. The ion implantation is performed while utilizing the gate electrode 105 and the element isolation oxide film 102 as a mask, positions of the pair of the lightly doped diffusion regions 106 having n-type conductivity are self-aligned without adjusting a position of a mask.

Figure 4A:
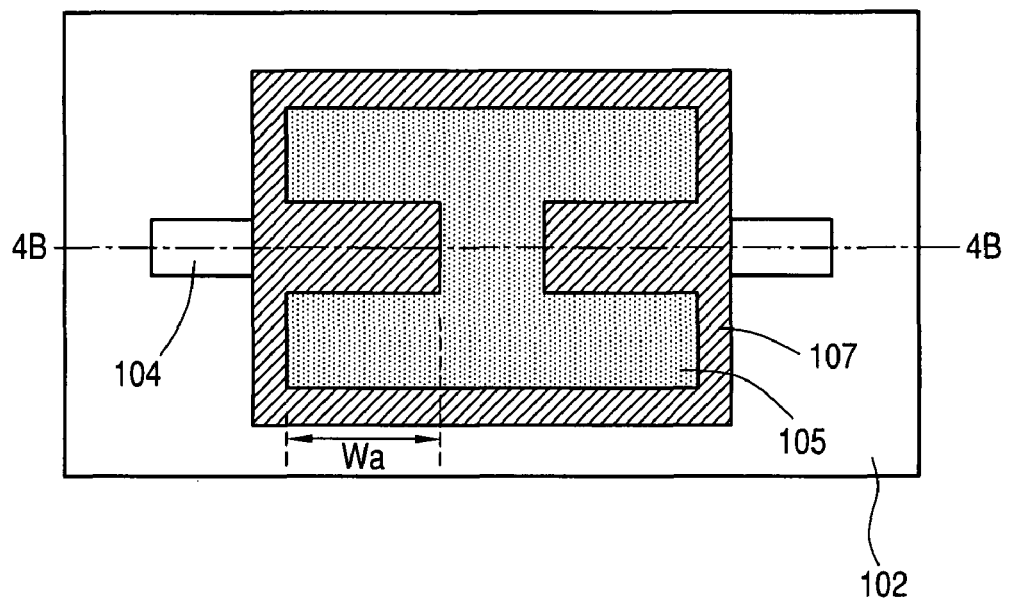
FIG. 4A is a plan view showing the first embodiment of the MOS transistor according to the present invention in a further step of manufacturing.
Figure 4B:
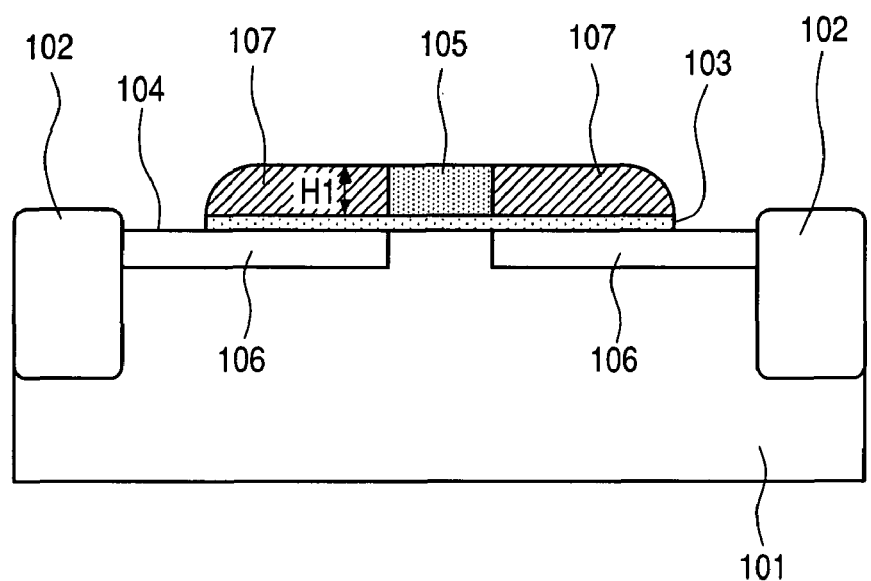
FIG. 4B is a cross-sectional view showing the first embodiment taken along 4B-4B line of FIG. 4A.

FIG. 4A is a plan view showing the first embodiment in a further step of manufacturing. FIG. 4B is a cross-sectional view showing the first embodiment taken along 4B-4B line of FIG. 4A. Subsequently a sidewall insulating film having a thickness equal to or thicker than a thickness (H1) of the gate electrode 105 is formed by using a well-known oxidative technology. As shown in FIGS. 4A and 4B, the sidewall insulating film is partially etched by using a well-known etch-back technology, and thus a residual sidewall insulating film 107, which is not removed, is partially formed on the surfaces of the element isolation oxide film 102 and the gate oxide film 103 so as to surround sidewalls of the gate electrode 105. The sidewall insulating film is composed of a material such as an oxide film and a nitride film. The residual sidewall insulating film 107 is not formed on two parts of the gate oxide film 103, below which parts source and drain regions (corresponding to heavily doped diffusion regions 108 of FIG. 5B) will be partially formed in the n-type lightly doped diffusion regions 106 in a later step, so that the two parts of the gate oxide film 103, below which the source and drain regions will be formed, are also removed in the etching step. The residual sidewall insulating film 107 sandwiched by the opposition parts of the gate electrode 105, which film is not removed by the etching step, has the substantially same thickness as the gate electrode 105. It is preferable that the residual sidewall insulating film 107 sandwiched by the opposition parts of the gate electrode 105 is substantially flat. However, if the residual sidewall insulating film 107 functions as a mask in a later step in which the heavily doped diffusion regions 108 are formed, it is not necessary that the residual sidewall insulating film 107 is substantially flat. The residual sidewall insulating film 107 may have a substantially flat structure, the surface of which includes concavities and convexities. It is preferable that the residual sidewall insulating film 107 has the substantially same thickness as the gate electrode 105. If the residual sidewall insulating film 107 functions as a mask, the residual sidewall insulating film 107 may have a thickness deviated away from the thickness of the gate electrode 105. The residual sidewall insulating film 107 may have the substantially same thickness as the gate electrode 105.

Figure 5A:
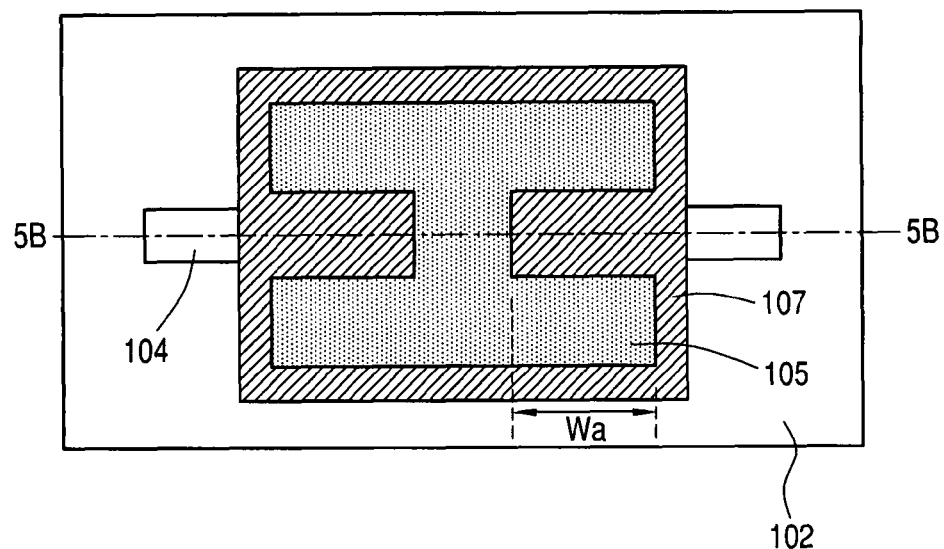
FIG. 5A is a plan view showing the first embodiment of the MOS transistor according to the present invention.
Figure 5B:
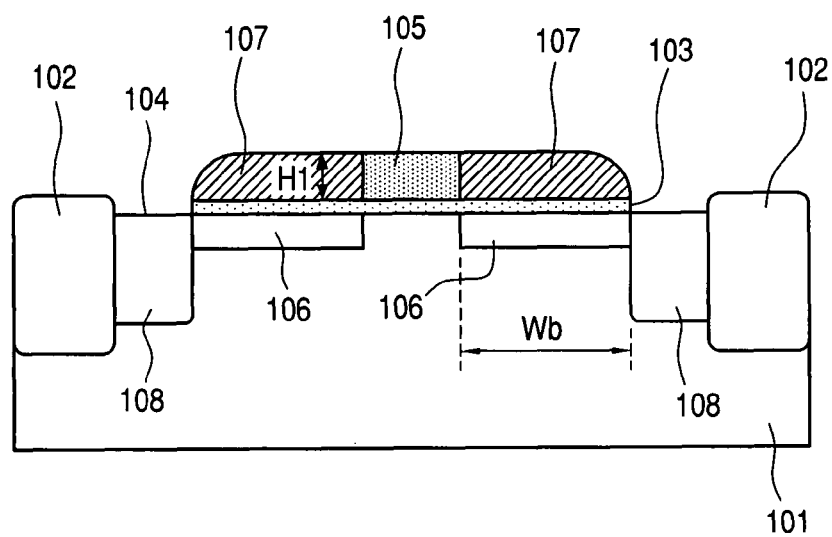
FIG. 5B is a cross-sectional view showing the first embodiment taken along 5B-5B line of FIG. 5A.

FIG. 5A is a plan view showing the first embodiment in a further step of manufacturing. FIG. 5B is a cross-sectional view showing the first embodiment taken along 5B-5B line of FIG. 5A. As shown in FIGS. 5A and 5B, a pair of heavily doped diffusion regions 108 having the n-type conductivity are partially formed in the n-type lightly doped diffusion regions 106 by further implanting ionized n-type dopants onto the n-type lightly doped diffusion regions 106 on which the gate electrode 105 is removed in the etching step. The ion implantation is performed while utilizing the gate electrode 105, the element isolation oxide film 102, and the residual sidewall insulating film 107 as a mask. The ion implantation is performed by using a well-known ion implantation technology under a condition that the ionized n-type dopants such as a phosphorous are dosed at a rate of $5 \times 10^{15}$ cm$^{-2}$ and at an acceleration voltage of 50 keV. The n-type heavily doped diffusion regions 108, whose conductivity is higher than that of the n-type lightly doped diffusion regions 106, respectively corresponds to source and drain regions. The heavily doped diffusion regions 108 are partially formed in the n-type lightly doped diffusion regions 106 and the element region 104 so as to be adjacent to edges of the residual sidewall insulating film 107 in the longitudinal direction of the element region 104, and thus the heavily doped diffusion regions 108 are positioned so as not to overlap with the residual sidewall insulating film 107. The heavily doped diffusion regions 108 are separated from the gate electrode 105. The ion implantation for forming the heavily doped diffusion regions 108 is performed while utilizing the gate electrode 105, the element isolation oxide film 102, and the residual sidewall insulating film 107 as a mask, so that the heavily doped diffusion regions 108 are self-aligned without adjusting a position of a mask. Each length of the n-type lightly doped diffusion regions 106 in the longitudinal direction of the element region 104, which length is defined as a LDD length, is denoted by Wb in FIG. 5B. FIGS. 5A and 5B show a structure of the first embodiment in accordance with the MOS transistor of the present invention.

As shown in FIGS. 5A and 5B, the first embodiment is an n-p-n junction configured by source and drain regions, a channel region sandwiched by the source and drain regions. The source and drain regions correspond to the heavily doped diffusion regions 108, each having the n-type conductivity. The channel region corresponds to the element region having the p-type conductivity which is sandwiched by the lightly doped diffusion regions 106 whose dopant concentration is lower than that of the heavily doped diffusion regions 108. The gate electrode 105 includes the opposition parts and combination part sandwiched at the middle point of the opposition parts in the direction of the n-p-n junction. The opposition parts are substantially parallel to each other in the direction of the n-p-n junction.

Second Embodiment

Figure 6A:
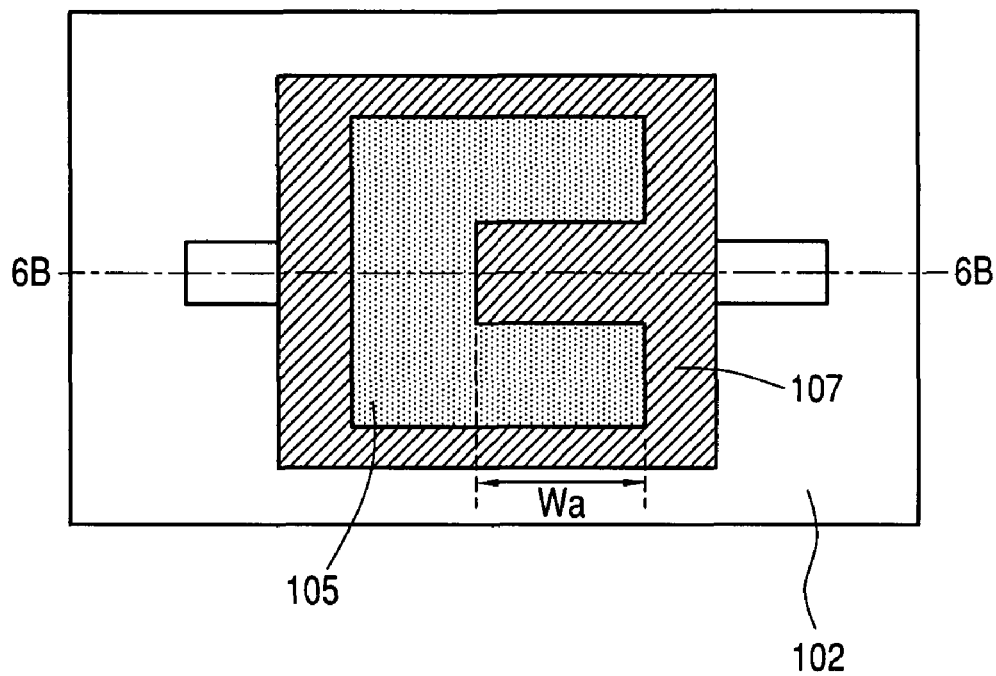
FIG. 6A is a plan view showing a second embodiment of the MOS transistor according to the present invention.
Figure 6B:
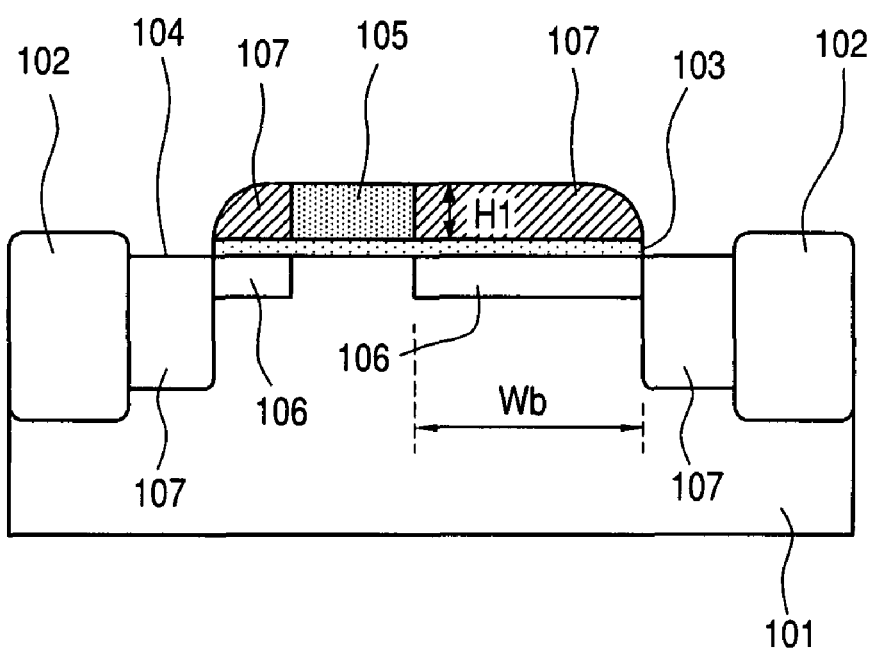
FIG. 6B is a cross-sectional view showing the second embodiment taken along 6B-6B line of FIG. 5A.

FIG. 6A is a schematic plan view showing a second embodiment of the MOS transistor according to the present invention. FIG. 6B is a schematic cross-sectional view of the second embodiment taken along the 6B-6B line of FIG. 6A. In the FIGS. 6A and 6B, elements similar to those of the first embodiment shown in FIGS. 5A and 5B are denoted by the same numerals as FIGS. 5A and 5B. As shown in FIGS. 6A and 6B, a gate electrode 105 has a C-shaped structure. The gate electrode 105 includes two opposition parts and a combination part sandwiched by the two opposition parts. In a longitudinal direction (in the direction of an n-p-n junction direction) of an element region 104 (in which n-type lightly doped diffusion regions 106, a p-type channel region sandwiched by the n-type lightly doped diffusion regions 106, and n-type heavily doped diffusion regions 107 corresponding to source and drain regions are partially formed), each length of the two opposition parts is longer than that of the combination part. It is configured that the two opposition parts are substantially parallel to the longitudinal direction. The opposition parts are positioned so as not to overlap with the element region 104. The combination part is sandwiched at each edge of the opposition parts in the direction of the longitudinal direction. By forming the gate electrode 105 as the C-shaped structure (in other wards, an asymmetrical shape), a variable region, whose length in the longitudinal direction of the element region 104 is denoted by Wa in FIG. 6A, is provided in either one of source or drain regions. The length Wa of the variable region can be variably adjusted by adjusting the lengths of the opposition parts of the gate electrode 105. In the second embodiment having the asymmetric structure of the source and drain regions, similar effects as the first embodiment in FIGS. 5A and 5B are allowed.

Figure 7:
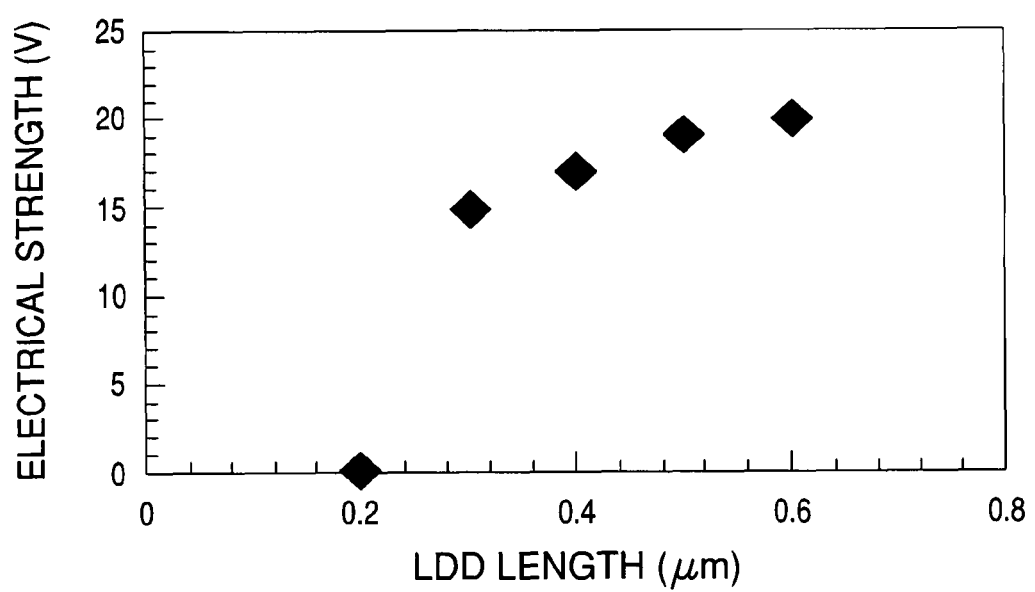
FIG. 7 is a graph showing a relation between a LDD length and an electrical strength of a MOS transistor in accordance with the present invention.

FIG. 7 is a graph showing a relation between a LDD length and an electrical strength of a MOS transistor in accordance with the present invention. As shown in FIG. 7, it is accurate that an increase of the LDD length strengthens the electrical strength of the MOS transistor.

According to the present invention, the pair of the lightly doped diffusion regions 106, which is partially formed in the element region 104 while utilizing the gate electrode 105 and the element isolation oxide film 102 as a mask, are self-aligned. Thus, the ion implantation is performed only once without preparing another mask. Therefore, a photolithographic process can be eliminated. In addition, the gate electrode 105 has the opposition parts between which the residual sidewall insulating film 107 having the substantially same thickness as the gate electrode 105 are fulfilled. By further performing the ion implantation while utilizing the gate electrode 105, the element isolation oxide film 102, and the residual sidewall insulating film 107 as a mask, the heavily doped diffusion regions 108 are also self-aligned. Accordingly, the lightly doped diffusion regions 106 and the heavily doped diffusion regions 108, whose dopants are uniformly distributed, can be partially formed in the element region 104 defined by the element isolation region 102, and thus the lightly doped diffusion regions 106, whose LDD length Wb are substantially uniform, can be formed. Therefore, uniformity of the elements of the MOS transistors such as on-resistance and electrical strength can be improved. By arbitrarily designing the length Wa of the opposition part of the gate electrode 105 in FIGS. 2A, 3A, 4A, 5A, and 6A, the lightly doped diffusion regions 106, each having a LDD length necessary for a predetermined electrical strength, can be formed.

By configuring a length between the opposition parts of the gate electrode 105 to be in a range of a length two times the thickness H1 of the gate electrode 105, the residual sidewall insulating film 107 are fulfilled in the space between the opposition parts so as to be substantially flat. The residual sidewall insulating film 107 is utilized as a mask in the ion implantation process of the heavily doped diffusion regions 108. Consequently, the lightly doped diffusion regions 106, whose the LDD length Wb is determined according to predetermined electrical strength, can be formed so as to be self-aligned.

According to the present invention, a photolithographic process at the ion implantation process can be eliminated since the lightly doped diffusion regions are formed by the ion-implantation while utilizing the gate electrode and element isolation film as a mask. The ion-implantation process for forming the lightly doped diffusion regions is performed only once, thus decreasing the number of processes and a processing period for forming the MOS transistor. Therefore, a high-voltage-resistant MOS transistor with high cost effectiveness can be provided.

The first and second embodiments in accordance with the present invention, which are described as an NMOS transistor having the n-p-n junction, can be modified into a PMOS transistor having a p-n-p junction.

The first and second embodiments can be modified into a semiconductor device having a MOS transistor structure.

This application is based on Japanese Patent Application No. 2006-267822 which is herein incorporated by reference.

What is claimed is:

1. A MOS transistor comprising:
a first conductive type semiconductor substrate;
an element isolation oxide film formed in said semiconductor substrate;
an element region formed in said semiconductor substrate while being defined by said element isolation oxide film;
a gate oxide film formed over a surface of said element region;
a gate electrode formed on surfaces of said element isolation oxide film and said gate oxide film;
a sidewall insulating film formed so as to surround sidewalls of said gate electrode;
a pair of lightly doped diffusion regions having a second type of conductivity opposite to said first type of conductivity formed in said element region positioned beneath said sidewall insulating film, said lightly doped diffusion regions being opposed to each other via inner ends thereof; and
a pair of heavily doped diffusion regions having said second type of conductivity, said heavily doped diffusion regions being respectively connected to outer ends of said lightly doped diffusion regions and each having a conductivity higher than that of said lightly doped diffusion regions;
wherein
said gate electrode includes a pair of separate and elongated opposition parts and a connection part connecting said pair of opposition parts while said opposition parts are opposed to each other so as not to overlap said element region and said connection part overlaps said element region, and
said gate oxide film does not exist beneath the opposition parts.

2. A MOS transistor according to claim 1,
wherein said sidewall insulating film sandwiched by said opposition parts of said gate electrode is substantially flat and has substantially the same thickness as said gate electrode.

3. A MOS transistor according to claim 1,
wherein each of said opposition parts is substantially parallel to said junction direction, and
said connection part is sandwiched at each middle point of said opposition parts along said junction direction.

4. A MOS transistor according to claim 1,
wherein each length of said opposition parts in a junction direction of said heavily doped diffusion region and said lightly doped diffusion region is longer than a width of said connection part.

5. A MOS transistor according to claim 1,
wherein said lightly doped diffusion regions are formed through an ion implantation process using said gate electrode as a mask.

6. A MOS transistor according to claim 1,
wherein said highly doped diffusion regions are formed through an ion implantation process using sidewall insulating firm as a mask.

* * * * *